US012772414B2

(12) United States Patent
Chen

(10) Patent No.: US 12,772,414 B2
(45) Date of Patent: Oct. 20, 2026

(54) LIQUID COOLING ADAPTOR MANIFOLD MOUNTING AND HOSE MANAGEMENT

(71) Applicant: DELL PRODUCTS L.P., Round Rock, TX (US)

(72) Inventor: Yi-Hsuan Chen, Taoyuan City (TW)

(73) Assignee: Dell Products L.P., Round Rock, TX (US)

( * ) Notice: Subject to any disclaimer, the term of this patent is extended or adjusted under 35 U.S.C. 154(b) by 197 days.

(21) Appl. No.: 18/492,991

(22) Filed: Oct. 24, 2023

(65) Prior Publication Data

US 2025/0133694 A1 Apr. 24, 2025

(51) Int. Cl.
*H05K 7/20* (2006.01)
*H05K 7/14* (2006.01)

(52) U.S. Cl.
CPC ....... *H05K 7/20272* (2013.01); *H05K 7/1498* (2013.01); *H05K 7/20645* (2013.01); *H05K 7/20772* (2013.01)

(58) Field of Classification Search
CPC ............. H05K 7/20272; H05K 7/1498; H05K 7/20645; H05K 7/20772
See application file for complete search history.

(56) References Cited

U.S. PATENT DOCUMENTS

| | | | | | |
|---|---|---|---|---|---|
| RE25,940 | E * | 12/1965 | Davids | B01D 9/04 | 62/123 |
| 6,394,138 | B1 * | 5/2002 | Vu | C23C 16/45561 | 137/884 |
| 10,917,998 | B2 | 2/2021 | Shelnutt et al. | | |
| 2010/0002393 | A1 * | 1/2010 | Campbell | H05K 7/20772 | 361/699 |
| 2013/0025818 | A1 * | 1/2013 | Lyon | H05K 7/20781 | 165/181 |
| 2016/0270260 | A1 * | 9/2016 | Franz | H05K 7/20781 | |
| 2022/0338384 | A1 | 10/2022 | Hogan et al. | | |

* cited by examiner

*Primary Examiner* — Jacob R Crum
(74) *Attorney, Agent, or Firm* — Larson Newman, LLP

(57) ABSTRACT

A mounting assembly is provided for mounting a liquid cooling adaptor manifold to a server rack. The mounting assembly includes the liquid cooling adaptor, a mounting adaptor, and a mounting bracket. The liquid cooling adaptor provides a cooling liquid from a source via first connectors of a first type to a device via second connectors of a second type. The mounting adaptor is affixed to the liquid cooling adaptor manifold and to the mounting bracket. The mounting bracket is affixed to a side wall of a server rack.

8 Claims, 4 Drawing Sheets

LIQUID COOLING ADAPTOR MANIFOLD MOUNTING AND HOSE MANAGEMENT

FIELD OF THE DISCLOSURE

This disclosure generally relates to information handling systems, and more particularly relates to providing a liquid cooling adaptor manifold mounting and hose management kit in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A mounting assembly may provided for mounting a liquid cooling adaptor manifold to a server rack. The mounting assembly may include the liquid cooling adaptor, a mounting adaptor, and a mounting bracket. The liquid cooling adaptor may provide a cooling liquid from a source via first connectors of a first type to a device via second connectors of a second type. The mounting adaptor may be affixed to the liquid cooling adaptor manifold and to the mounting bracket. The mounting bracket may be affixed to a side wall of a server rack.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
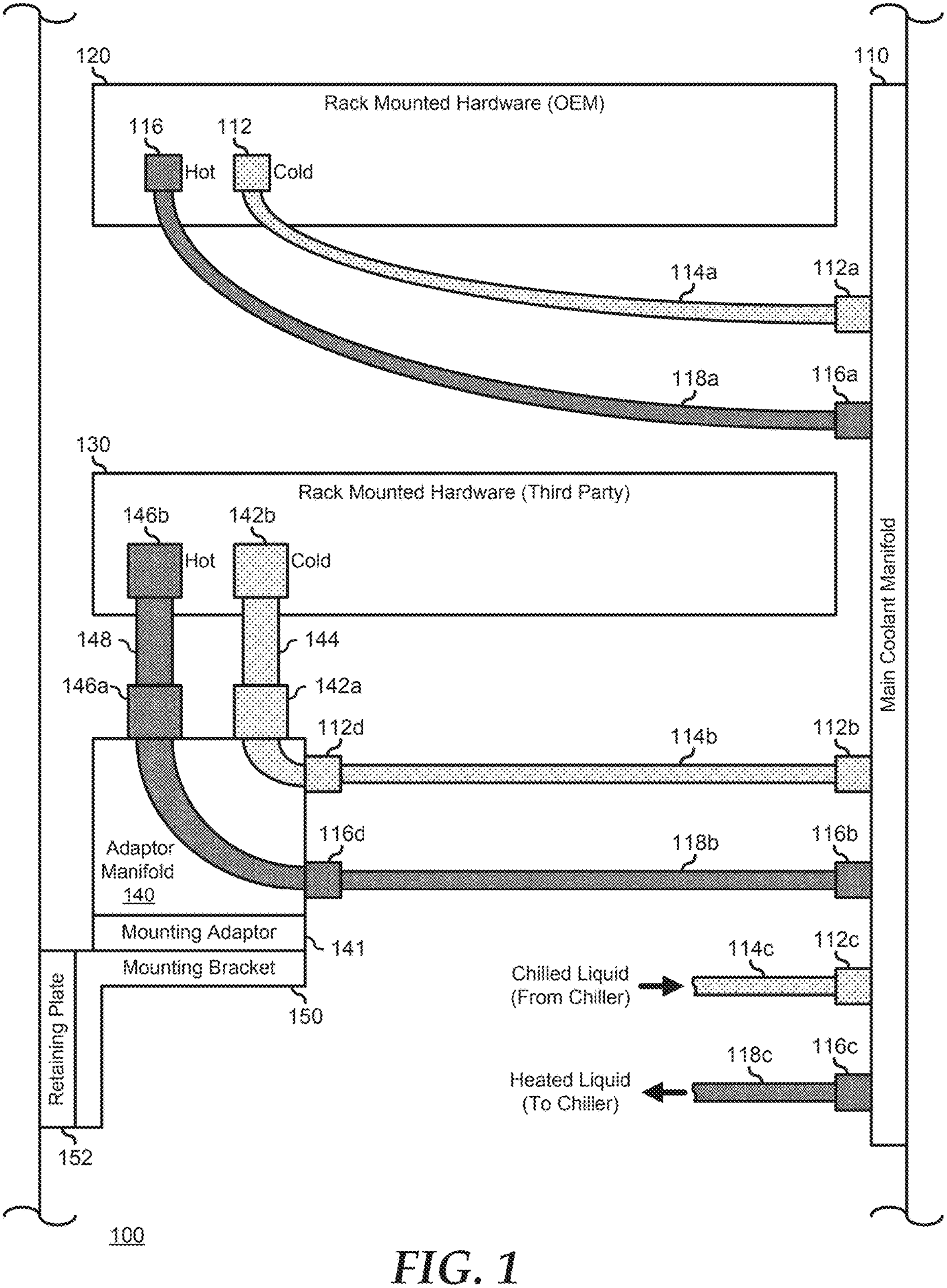
FIG. 1 is a block diagram of a server rack according to an embodiment of the current disclosure.

FIG. 1 illustrates a server rack 100 that represents a modular cabinet for mounting various types of rack mounted hardware 120 and 130. Server rack 100 may be configured in accordance with one or more server rack standards such as the Electronic Industries Alliance EIA-310-D, standard for Cabinets, Racks, Panels, and Associated Equipment, or the like, and may include a 19-inch rack, a 23-inch rack, or another rack layout, as needed or desired. Server rack 100 is configured to provide liquid cooling to hardware 120 and 130 via a main coolant manifold 110. In particular, main coolant manifold 110 receives chilled coolant liquid from a chiller (not illustrated) and provides the chilled coolant liquid to hardware 120 and 130. Hardware 120 and 130 are configured to distribute the chilled coolant liquid to heat exchangers affixed to various heat-generating components within the hardware. The heat from the components is transferred vie the heat exchanger to heat the coolant liquid, and the heated coolant liquid is returned to main coolant manifold 110, and thereby flows back to the chiller that re-chills the coolant liquid. Thus the liquid cooling system employed on server rack 100 is a closed-loop cooling system. The details of cooling heat-generating components in hardware, of processing heated coolant liquid in a chiller, and the distribution of coolant liquid via a main coolant manifold are known in the art and will not be further described herein, except as may be needed to illustrate the current embodiments.

The liquid cooling system utilizes coolant hoses that are affixed to the various components of the liquid cooling system by standardized receptacles. Here, main coolant manifold 110 includes chilled liquid connectors 112 that are connected to chilled liquid hoses 114, and heated fluid connections 116 that are connected to heated liquid hoses 116. In particular, the chilled coolant liquid is provided from the chiller via one or more chilled liquid hose 114*c* that is connected to main coolant manifold 110 via chilled liquid connector 112*c*. The chilled coolant liquid is distributed to various chilled liquid connectors 112*a* and 112*b*, as described further below. Moreover, the heated coolant liquid is returned to the chiller via one or more chilled liquid hose 118*c* that is connected to the main coolant manifold via chilled liquid connector 116*c*. The heated coolant liquid is gathered from various heated liquid connectors 116*a* and 116*b*, as described further below.

Server rack 100 may be provided by a particular original equipment manufacturer (OEM) that may populate the server rack with hardware that is also provided by the OEM. For example, hardware 120 is illustrated as being an element of OEM hardware. However because server rack 100 is a modular cabinet that is capable of retaining other equipment that is in conformance with the associated rack standard, the server rack may be populated with hardware that is not provided by the OEM. For example, hardware 130 is illustrated as being an element of third party hardware.

Liquid coolant connectors may be provided by various manufacturers, and may be designed to different specifications or configurations. For example liquid coolant connectors can be provided in accordance with a Universal Quick Disconnect (UQD) standard, but may nevertheless have one of at least two different, non-compatible fitting styles, such as UQD02 fittings and UQD04 fittings, or other styles of fittings, as needed or desired. Connectors 112 and 116 are illustrated by a single block, but such connectors may be made up of two-piece fittings where the two pieces are complimentary, such as where a connector pair has a male fitting and a complimentary female fitting, as needed or desired.

As illustrated main coolant manifold 110 and OEM hardware 120 are equipped with a common type of liquid coolant connector (for example connectors 112 and 116), these components of server rack 100 being provided by the common OEM. On the other hand hardware 130, being third party hardware, may be provided with a different style of liquid connectors, illustrated as a chilled liquid connector 142 and a heated liquid connector 146. The connector type of connectors 112 and 116 is incompatible with the connector type of connectors 142 and 146. As such, server rack 100 includes an adaptor manifold 140 that includes a chilled liquid connector **112*d* connected to chilled liquid hose 114*b* and a heated liquid connector 116*d* connected to heated liquid hose 116*b*. Adaptor manifold 140 further includes a chilled liquid connector 142*a* connected to chilled liquid hose 144 and a heated liquid connector 146*a* connected to heated liquid hose 146. Adaptor manifold 140 internally connects chilled liquid connector 112*d* with chilled liquid connector 142*a*, and heated liquid connector 116*d* with heated liquid connector 146*a***.

Finally chilled liquid hose 144 is connected to chilled liquid connector **142*b* on third party hardware 130, and heated liquid hose 148 is connected to heated liquid connector 146*b* on the third party hardware. Hence with the inclusion of adaptor manifold 140, server rack 100 and particularly main coolant manifold 110 can utilize not only OEM hardware 120 with compatible connectors 112 and 116, but also can utilize third party hardware 130 with incompatible connectors 142 and 146**. As illustrated two different styles of connectors are shown, but that is not necessarily so, and multiple different styles of non-compatible connectors may be utilized on multiple different types of hardware through the inclusion of an appropriate adaptor manifold that adapts between connector styles, as shown.

An adaptor manifold such as adaptor manifold 140 may be commonly obtained for various combinations of liquid connector styles. Moreover, adaptor manifolds may commonly be provided that adapt from a single pair of the first connector style with multiple pairs of the second connector style. In this way, a single manifold adaptor may be utilized to connect a common main coolant manifold to multiple elements of hardware that utilize the second style of connector. For example a manifold adaptor may include two, four, or more pairs of connectors of the second style. For this reason it is not typically desirable to leave adaptor manifolds hanging freely between the main coolant manifold and the hardware, and manifold adaptors may typically be mechanically affixed to server rack 100. However due to the multiple types of manifold adaptors, the mechanisms utilized for mechanically affixing the manifold adaptors may typically be as varied as the number of different types of manifold adaptors.

Figure 2A:
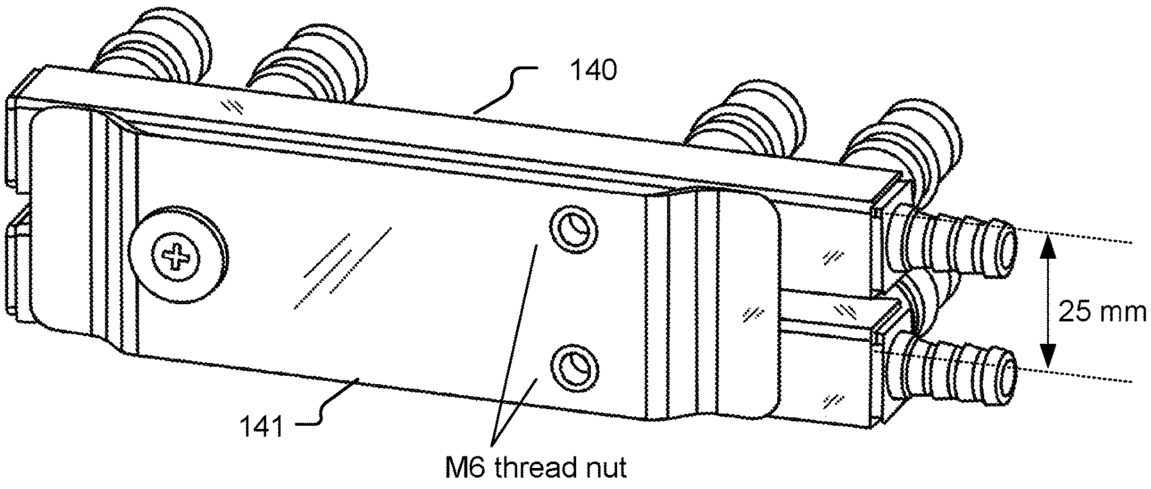
FIG. 2A is a perspective view of an adaptor manifold and mounting adaptor.

In a particular embodiment, manifold adaptor 140 is provided with a mounting adaptor 141 that is mechanically affixed to manifold adaptor 140, illustrated in FIG. 2A. Mounting adaptor 141 may be affixed to manifold adaptor 140 by any mounting mechanism as needed or desired. For example, mounting adaptor 141 may be welded to manifold adaptor 140, may be rivetted to the manifold adaptor, may be adhesively bonded to the manifold adaptor, may be screwed to the manifold adaptor, or may be secured to the manifold adaptor by any suitable attachment mechanism, as needed or desired.

Figure 2B:
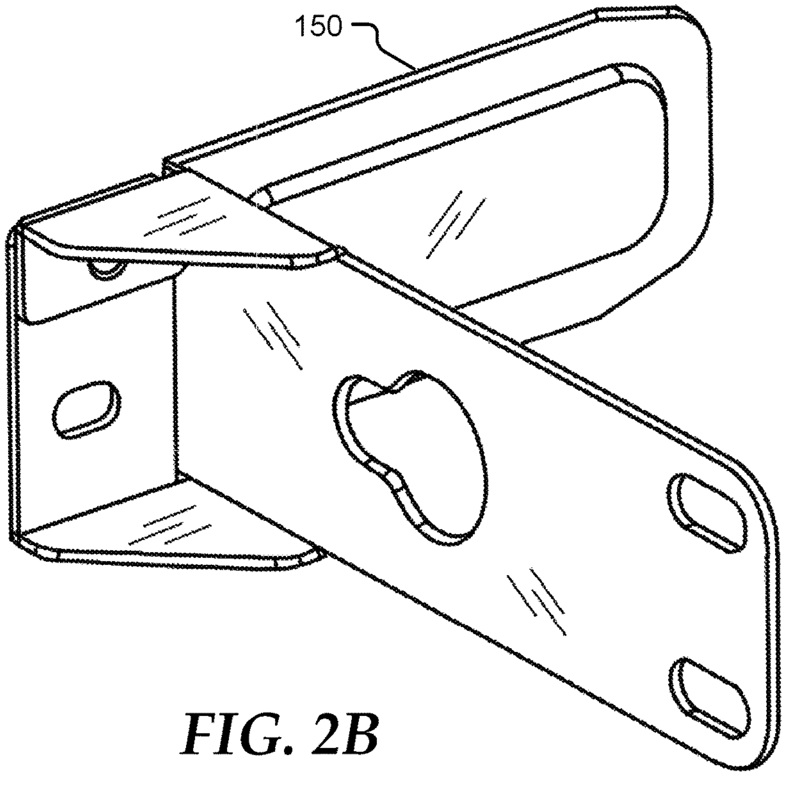
FIG. 2B is a perspective view of a mounting bracket.
Figure 3A:
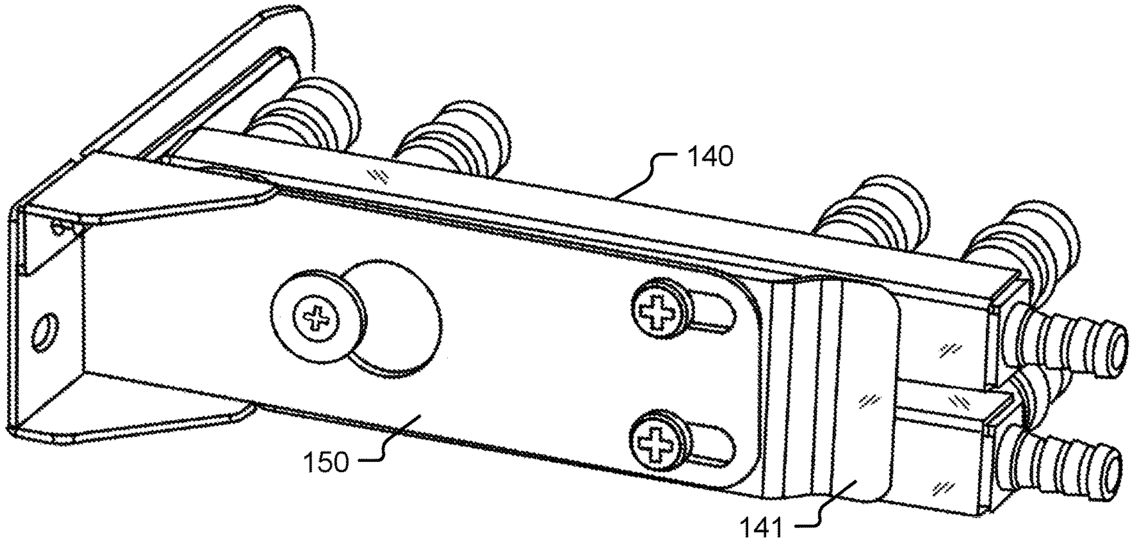
FIG. 3A is a perspective view of the adaptor manifold and mounting adaptor assembled to the mounting bracket.

Mounting adaptor 141 includes a common mounting arrangement for mounting to a mounting bracket 150, illustrated in FIG. 2B. Mounting adaptor 141 may be mounted to mounting bracket 150 by any mounting mechanism as needed or desired. For example, mounting adaptor 141 may be welded to mounting bracket 150, may be rivetted to the mounting bracket, may be screwed to the mounting bracket, or may be secured to the mounting bracket by any suitable attachment mechanism, as needed or desired. In a particular embodiment, mounting adaptor 141 is mounted to mounting bracket 150 by a complimentary slot and stud arrangement and at least one mounting screw, as shown in FIG. 3A. In this way, a wide variety of types of adaptor manifolds 140 can be removably affixed to mounting bracket 150, the assembly of the adaptor manifold and the mounting bracket being provided within server rack 100 only when necessary to provide liquid cooling to hardware with non-compatible connectors, as needed or desired.

Figure 2C:
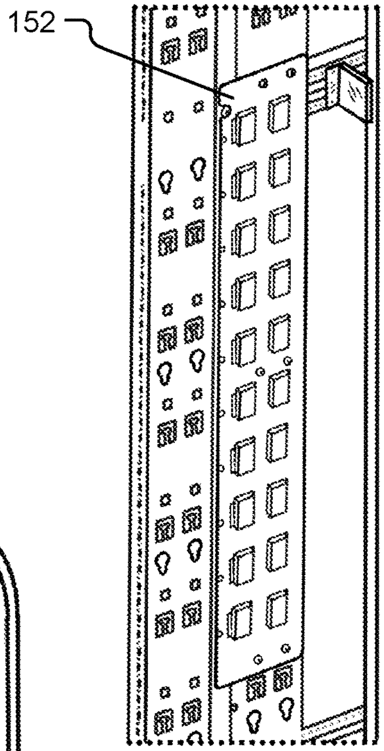
FIG. 2C is a perspective view of a retaining plate.
Figure 3B:
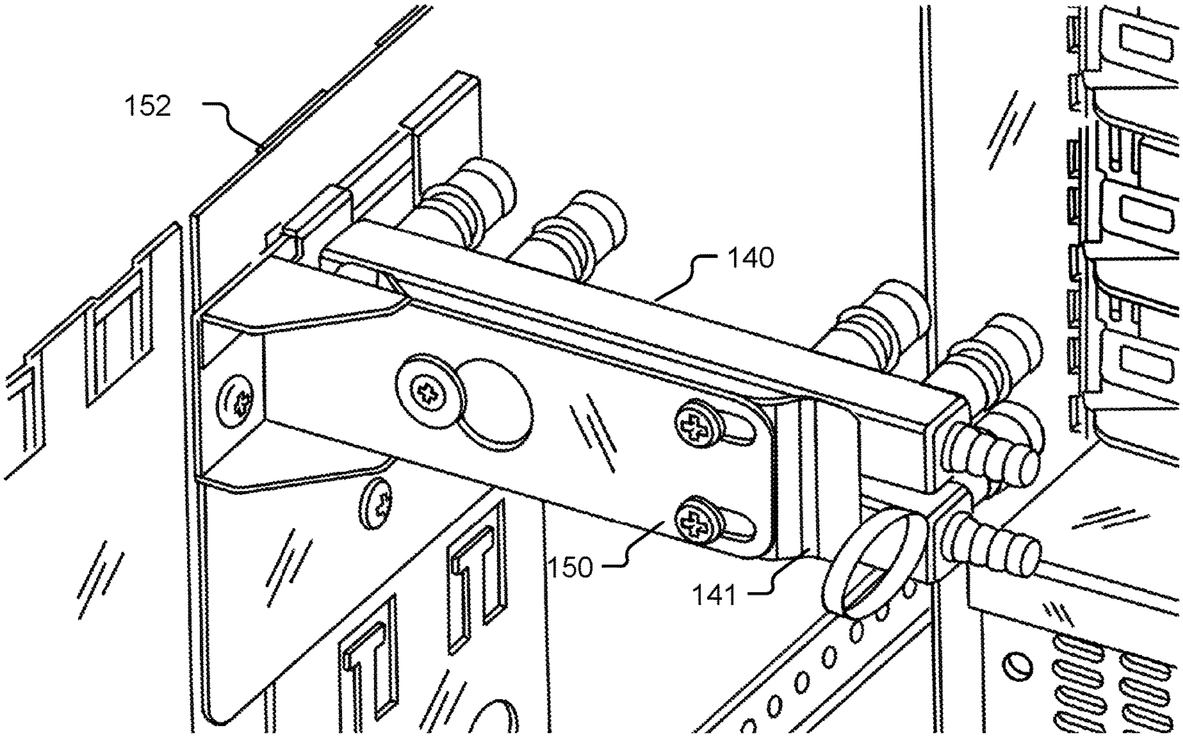
FIG. 3B is a perspective view of the adaptor manifold, the mounting adaptor, and the mounting bracket assembled to the retaining plate.

Mounting bracket 150 is in turn configured with a common mounting arrangement for mounting to the side of server rack 100 by a retaining plate 152, illustrated in FIG. 2C. In a particular embodiment, mounting bracket 150 is affixed to retaining plate 152 by a tongue and slot attachment, and held firmly in place by at least one mounting screw, as shown in FIG. 3B.

Figure 4:
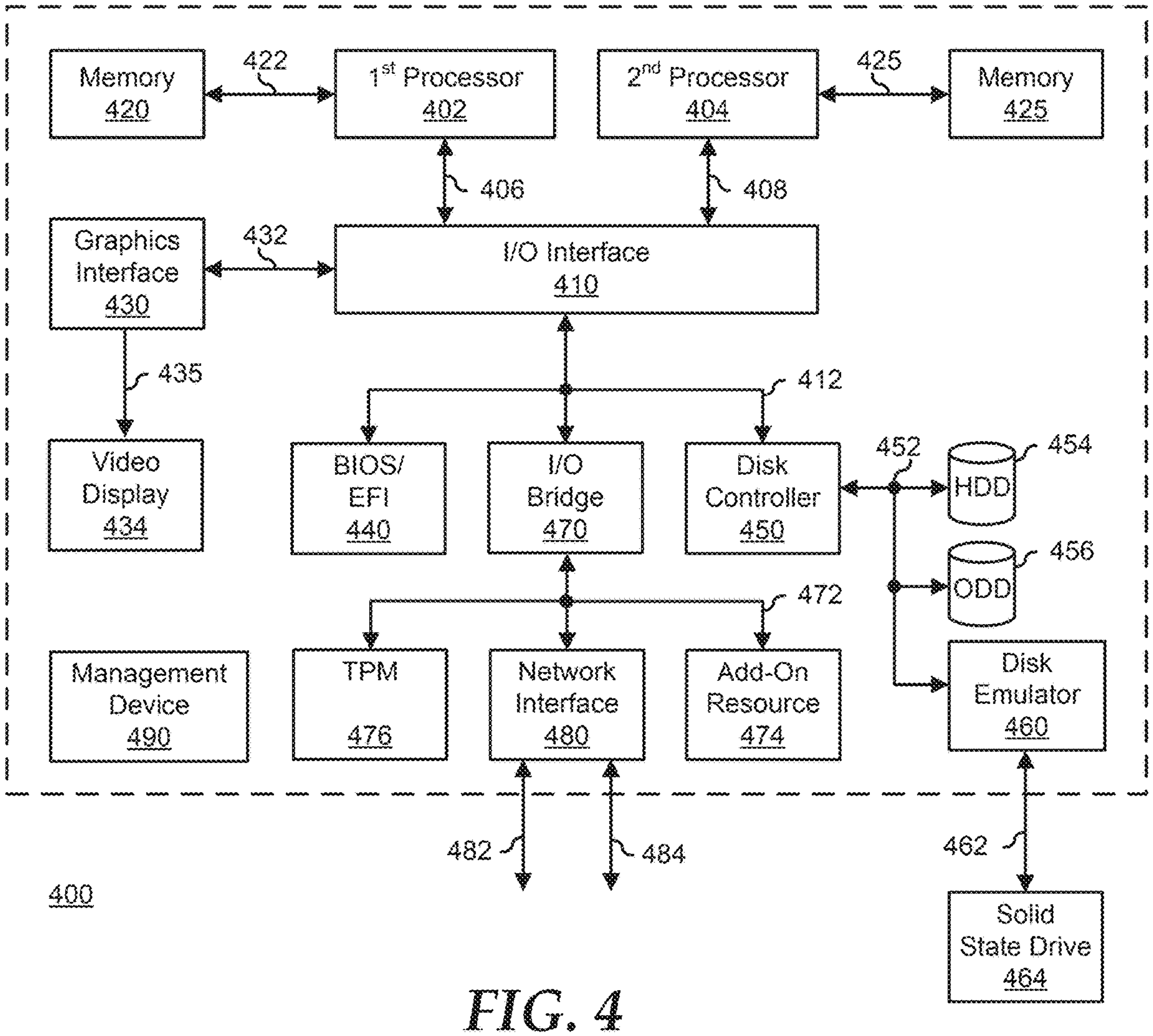
FIG. 4 is a block diagram illustrating a generalized information handling system according to another embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A mounting assembly for mounting a liquid cooling adaptor manifold to a server rack, the mounting assembly comprising:

a liquid cooling adaptor configured to receive chilled cooling liquid from a source via a first connector of a first type, to supply the chilled cooling liquid to a first device via a second connector of a second type and to a second device via a third connector of the second type, to receive heated cooling liquid from the first device via a fourth connector of the second type and from the second device via a fifth connector of the second type, and to return the heated cooling liquid to the source via a sixth connector of the first type;

a mounting adaptor affixed to the liquid cooling adaptor manifold; and a mounting bracket to which the mounting adaptor is affixed and which is affixed to a side wall of the server rack; and a retaining plate affixed to the side wall, wherein the mounting bracket is affixed to the retaining plate, wherein the mounting adaptor is permanently affixed to the liquid cooling adaptor manifold.

2. The mounting assembly of claim 1, wherein in permanently affixing the mounting adaptor to the liquid cooling adaptor, the mounting adaptor is welded to the liquid cooling adaptor manifold.

3. The mounting assembly of claim 1, wherein in permanently affixing the mounting adaptor to the liquid cooling adaptor, the mounting adaptor is riveted to the liquid cooling adaptor manifold.

4. The mounting assembly of claim 1, wherein in permanently affixing the mounting adaptor to the liquid cooling adaptor, the mounting adaptor is adhesively bonded to the liquid cooling adaptor manifold.

5. The mounting assembly of claim 1, wherein the mounting adaptor is removably affixed to the mounting bracket.

6. The mounting assembly of claim 5, wherein the mounting adaptor is screwed to the mounting bracket.

7. The mounting assembly of claim 1, wherein the mounting bracket is removably affixed to the retaining plate.

8. The mounting assembly of claim 7, wherein the mounting bracket is screwed to the retaining plate.

* * * * *